US009838766B2

(12) United States Patent
Kim et al.

(10) Patent No.: US 9,838,766 B2
(45) Date of Patent: Dec. 5, 2017

(54) SPEAKER AND MICROPHONE INTEGRATED DISPLAY PANEL

(71) Applicant: SAMSUNG DISPLAY CO., LTD., Yongin-si, Gyeonggi-do (KR)

(72) Inventors: Il Nam Kim, Hwaseong-si (KR); Won Sang Park, Yongin-si (KR); Yi Joon Ahn, Seoul (KR); Byeong-Hee Won, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 15 days.

(21) Appl. No.: 15/004,669

(22) Filed: Jan. 22, 2016

(65) Prior Publication Data

US 2016/0219354 A1   Jul. 28, 2016

(30) Foreign Application Priority Data

Jan. 22, 2015   (KR) ......................... 10-2015-0010851

(51) Int. Cl.
| H04R 1/00 | (2006.01) |
| H04R 1/02 | (2006.01) |
| G02B 5/30 | (2006.01) |
| H05K 1/14 | (2006.01) |

(52) U.S. Cl.
CPC ............ *H04R 1/028* (2013.01); *G02B 5/3033* (2013.01); *H04R 1/025* (2013.01); *H04R 2201/029* (2013.01); *H04R 2499/15* (2013.01); *H05K 1/147* (2013.01); *H05K 2201/056* (2013.01); *H05K 2201/10068* (2013.01); *H05K 2201/10083* (2013.01); *H05K 2201/10128* (2013.01); *H05K 2201/10681* (2013.01)

(58) Field of Classification Search
CPC .. H04R 1/028; H04R 2201/029; H04R 1/025; H04R 2499/15; H05K 2201/10128; H05K 2201/056; H05K 2201/10068; H05K 1/147; H05K 2201/10083; H05K 2201/10681; G02B 5/3033
See application file for complete search history.

(56) References Cited

U.S. PATENT DOCUMENTS

| 2007/0019134 | A1* | 1/2007 | Park ..................... G02F 1/133 |
| | | | 349/96 |
| 2009/0074226 | A1 | 3/2009 | Eaton et al. |
| 2009/0196452 | A1* | 8/2009 | Wan ..................... H04R 9/08 |
| | | | 381/365 |
| 2012/0135787 | A1* | 5/2012 | Kusunoki .......... H04M 1/0214 |
| | | | 455/575.8 |
| 2013/0336473 | A1 | 12/2013 | Xu et al. |
| 2014/0294217 | A1* | 10/2014 | Yamaguchi .......... H04M 1/035 |
| | | | 381/334 |

FOREIGN PATENT DOCUMENTS

| KR | 10-0672364 B1 | 1/2007 |
| KR | 10-2007-0023853 A | 3/2007 |
| KR | 10-1294668 B1 | 8/2013 |

* cited by examiner

*Primary Examiner* — Muhammad N Edun
(74) *Attorney, Agent, or Firm* — Innovation Counsel LLP

(57) ABSTRACT

Provided is a speaker and microphone integrated display panel including: a display panel having a display area and a non-display area surrounding the display area; and a simultaneously convertible film type speaker or film type microphone which is mounted to correspond to an air hole in the non-display area, in which the display panel and the film type speaker or the film type microphone are at least partially integrated so as to be drive-connected.

13 Claims, 8 Drawing Sheets

SPEAKER AND MICROPHONE INTEGRATED DISPLAY PANEL

RELATED APPLICATIONS

This application claims priority to, and the benefit of, Korean Patent Application No. 10-2015-0010851 filed in the Korean Intellectual Property Office on Jan. 22, 2015, the entire contents of which are incorporated herein by reference.

BACKGROUND

1. Field

The disclosure relates generally to a speaker and microphone integrated display panel, and more particularly, to a speaker and microphone integrated display panel in which a film type speaker serving both as a speaker and a microphone is integrated with a display panel to be drive-connected.

2. Description of the Related Art

Recently, with the information age in full swing, display technology has advanced rapidly. Various flat panel displays having excellent performance in terms of reduction in thickness, weight, and power consumption have been correspondingly developed and are quickly replacing an existing cathode ray tube (CRT).

Specific examples of such flat panel displays include a liquid crystal display (LCD), a plasma display panel (PDP) device, an field emission display (FED) device, an electro luminescence display (ELD) device, and the like, each of which commonly have a flat display panel for implementing an image. The flat display panel has a configuration in which a pair of transparent insulation substrates is bonded to each other while facing each other with a light emitting or polarization material layer therebetween.

In particular, the liquid crystal display has a liquid crystal cell between the pair of transparent insulation substrates, in order to display an image by controlling light transmittance of a liquid crystal by using an electric field. The field emission display device may include a substrate providing a pixel area and a peripheral area, and a flexible thin film encapsulation (TFE) layer for encapsulation in which at least one inorganic layer and at least one organic layer are alternately stacked on the substrate to seal the substrate.

These flat panel displays each include a display area displaying an image, and a non-display area located around the display area. In the non-display area, pads connected to a driver IC and wires connecting the display area and the pads are formed. Further, the pads are connected to an external flexible printed circuit board (FPCB) to receive a signal from an external source.

In a speaker and microphone attached display device of the related art, separate PCBs, which are connected with wires of a display panel, a speaker, and a microphone, respectively, are formed and connected to a system driving circuit unit (not illustrated) within a system including each of the display panel, the speaker, and the microphone.

Therefore, the wires of the display panel, the speaker and the microphone need to be connected to the separate PCBs, respectively, and individually connected in the driver IC, which makes circuit integration difficult and cumbersome.

Further, since the speaker or the microphone is individually installed externally at a predetermined position with respect to the display panel, there are problems in that it is necessary to consider the orientation at the time of assembling a set and separately assemble the wires of the speaker or the microphone. This makes the assembly process complicated. Also, a plurality of substrates is required, which increases the total thickness and assembly time of the apparatus.

The above information disclosed in this Background section is only for enhancement of understanding of the background of the described technology and therefore it may contain information that does not form the prior art that is already known in this country to a person of ordinary skill in the art.

SUMMARY

The described technology provides a speaker and microphone integrated flat display panel having advantages of drivably connecting a film type or small film type speaker to a display panel to thereby simplify assembly, reduce the size of a PCB, and to configure the film type speaker in a form of a film which is simultaneously convertible to a speaker and a microphone to thereby simplify an assembly process without requiring distinction between top and bottom directions of the set, reduce an assembly time, and make the entire set slim.

An exemplary embodiment provides a speaker and microphone integrated display panel including: a display panel having a display area and a non-display area surrounding the display area; a simultaneously convertible film type speaker mounted to correspond to an air hole of the non-display area, in which the display panel and the film type speaker are at least partially integrated so as to be drive-connected.

According to an exemplary embodiment, it is possible to provide a speaker and microphone integrated display panel which connects and drives a film type or small film type speaker to a display panel to thereby simplify assembly, reduce the size of a PCB, and configure the film type speaker in a form of a film which is simultaneously convertible to a speaker and a microphone to thereby simplify an assembly process, reduce an assembly time, and make the entire set slimmer.

DETAILED DESCRIPTION

Hereafter, a speaker and microphone integrated display panel according to the present invention will be described in detail with reference to the accompanying drawings.

Exemplary embodiments will be described below with reference to the accompanying drawings. Even though the exemplary embodiments to be described below disclose a display panel, the exemplary embodiments may be modified in various different ways, and the scope of the present invention is not limited to the following exemplary embodiments. The exemplary embodiments are provided for full understanding by those skilled in the art.

The various Figures are not necessarily to scale. All numerical values are approximate, and may vary. All examples of specific materials and compositions are to be taken as nonlimiting and exemplary only. Other suitable materials and compositions may be used instead.

Figure 1:
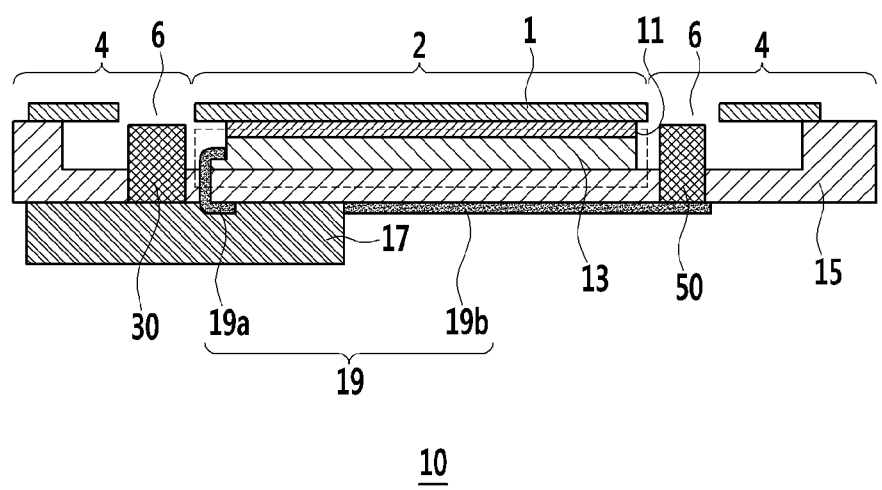
FIG. 1 is a cross-sectional view illustrating a microphone and speaker attached liquid crystal display of the related art.

FIG. 1 a cross-sectional view illustrating a speaker and microphone attached display device of the related art.

As illustrated in FIG. 1, a speaker and microphone attached display device of the related art includes: a display panel 10 which includes a display area 2 for performing a display, and a non-display area 4 which may be covered. The display panel 10 is configured to include first and second substrates 11 and 13 facing each other; first and second polarizers which may be attached to rear surfaces of the first substrate 11 and the second substrate 13, respectively; speakers 30 or microphones 50, which are installed on both sides of a frame 15 fixing and supporting the display panel 10, respectively; and a window layer 1 which protects an upper surface of the display panel 10 and has air holes 6 and 8 which are provided at portions corresponding to the speakers 30 or microphones 50 and through which sound is introduced and discharged.

On the first substrate 11 of the display panel 10 may be formed a gate line Gate and a data line Data which cross each other to define a pixel area, a thin film transistor (TFT) formed at an intersection of the gate line and the data line, and a thin film transistor array in which a pixel electrode (not illustrated) is formed in the pixel area.

Further, the display panel 10 has a printed circuit board (PCB) 17 to apply a driving signal to the gate line and the data line of the first substrate 11.

In general, the PCB 17 is disposed on the rear surface of the frame 15 on which the display panel 10, the speaker 30, and the microphone 50 are mounted, respectively. In this case, wires of the display panel 10, the speaker 30, and the microphone 50 may be electrically connected to the PCB 17 by using a film type flexible printed circuit (FPC) 19.

As described above, in the speaker and microphone attached display device of the related art, the PCB 17 is connected to the wires of the display panel 10, the speaker 30, and the microphone 50, and is also connected to a system driving circuit unit (not illustrated). Therefore, the wires of the display panel 10, the speaker 30, and the microphone 50 need to be connected to the PCB 17, respectively, and thus are difficult to assemble. They must also be individually connected in a driver IC, which makes circuit integration difficult.

Further, since the speaker 30 or the microphone 50 is individually installed at a predetermined position with respect to the display panel 10, it is necessary to consider its orientation at the time of assembling and to separately assemble the wires of the speaker 30 or the microphone 50, such that an assembly process is complicated. Furthermore, a plurality of substrates is required, which increases the total thickness of the apparatus and its assembly time.

Figure 2:
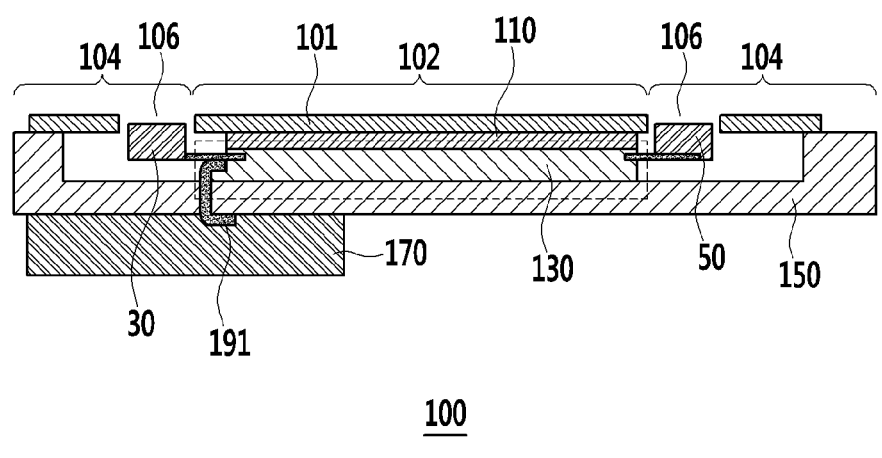
FIG. 2 is a schematic cross-sectional view for describing a concept of a speaker and microphone integrated display panel according to a first exemplary embodiment.

FIG. 2 is a cross-sectional view for describing a concept of a speaker and microphone integrated display panel according to a first exemplary embodiment.

Referring to FIG. 2, a speaker and microphone integrated display panel 100 according to the first exemplary embodiment may be divided into a display area 102 and a non-display area 104.

Here, the display area 102 is an area in which an image is displayed. The non-display area 104 is a region in which electrode circuits are covered by depositing or printing a pigment, and is an opaque region. The non-display area 104 includes air holes 106 and 108 as illustrated in FIG. 2.

In this case, the air holes 106 and 108 are openings facing the front of the panel 100, and may be formed to surround or be otherwise proximate to the speaker 30 and/or microphone 50.

The speaker and microphone integrated display panel 100 according to the first exemplary embodiment is configured such that in the non-display area 104 of the window layer 101, a film type speaker 30 or a film type microphone 50 is integrated in a form of a simultaneously convertible film shaped to correspond to the film type speaker or microphone air hole 106 or 108. It should be noted that, while reference numeral 30 denotes a film type speaker and reference numeral 50 denotes a film type microphone, the positions and functions of each can be interchanged, and thus the two collectively may simply be referred to as a film type speaker whose various components can be distributed within these locations in any manner.

Further, it can be appreciated that the film type speaker 30 or the film type microphone 50 is integrated with the display panel 100 and thus drive-connected by connecting wires thereof to each other, or is drive-connected to a single PCB 170 by using a film type FPC unit 191 connected to a pad formed in the non-display area 104 of the display panel 100, thereby reducing the size of the PCB 170 and simplifying the assembly process of the PCB 170.

In the FPC unit 191, a plurality of signal lines is formed on a base film having a flexible property, and a plurality of input pins and a plurality of output pins are configured at both ends, respectively. The FPC unit 191 is connected to the wires of the film type speaker 30 or the film type microphone 50 through its input pins at one end and connected to the data line and the gate line of the display panel 100 through its output pins at the other end.

Here, the display panel 100 is mounted with a plurality of link wires to form contact pad portions formed of a metal electrode layer and electrically connected to the FPC unit 191, and a plurality of chip on films (COFs) is formed on the FPC unit 191 and connected to the other end of the display panel 100 to be electrically connected to the PCB 170.

Now, specifically, referring to FIGS. 3 to 8, speaker and microphone integrated display panels according to first to seventh modified exemplary embodiments will be described.

Figure 3:
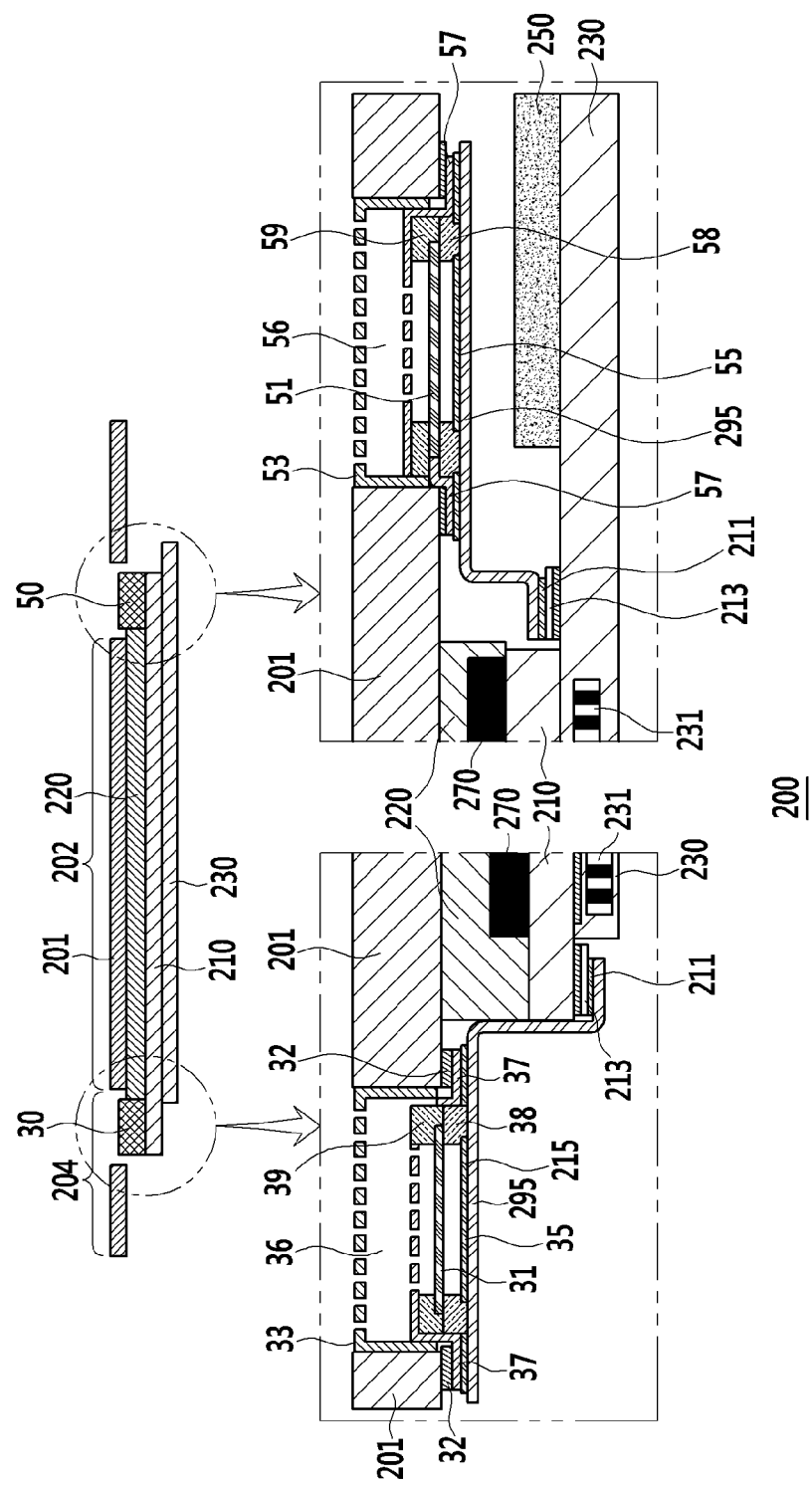
FIG. 3 is a partially enlarged cross-sectional view illustrating a connection relationship of a film type speaker and a display panel according to a first modified exemplary embodiment.

FIG. 3 is a partially enlarged cross-sectional view illustrating a connection relationship of a film type speaker and a display panel according to a first modified exemplary embodiment.

As illustrated in FIG. 3, a speaker and microphone integrated display panel 200 according to the first modified exemplary embodiment includes: upper and lower substrates 210 and 230 arranged opposite to each other; a window layer 201 formed larger than the upper and lower substrates 210 and 230 so as to protect the upper and lower substrates 210 and 230 and having air holes 206 and 208 in non-display areas 202 of the upper and lower substrates 210 and 230; a polarizer 270 sandwiched between the upper substrate 210 and the window layer 201 to perform a polarization function according to an operation of a polarization or light emitting material layer between the upper substrate 210 and the lower substrate 230; and a synthetic resin passivation layer 220 for supporting and compensating the polarizer 270. A film type speaker 30 or film type microphone 50 is integrated with the window layer 201 at a lower part of the air hole 206 or 208 to be drive-connected with a driver IC 250 by using an FPC unit 295 connected to first and second pad portions 213 formed in a non-display area 204 of the display panel 200.

For this purpose, the upper and lower substrates 210 and 230 are formed of rigid substrates and arranged opposite to each other to be offset so that a first pad portion 213 of the upper substrate 210 or a second pad portion 213 of the lower substrate 230 is exposed in the non-display area 204.

Accordingly, a wire of the film type speaker 30 may be electrically connected to an input terminal of a first FPC unit 295 and thus to a gate line or a data line of the upper substrate 210 via the first pad portion 213.

The film type speaker 30 includes a film type speaker substrate 31, a protection cap 33 mounted inside the air hole 206 to protect the film type speaker substrate 31, an upper film speaker electrode layer 35, and a lower film speaker electrode layer 37, and the lower film speaker electrode layer 37 may be connected to one end of the first FPC unit 295 of which the other end is connected to a first pad portion 213 through a pair of first adhesive portions 38.

Further, the pair of first adhesive portions 38 is disposed at a predetermined interval from the lower film speaker electrode layer 37, and the film speaker substrate 31 is installed on the pair of first adhesive portions 38, thereby securing a vibration space 36 below the film speaker substrate 31.

Further, a pair of second adhesive portions 39 are disposed on the pair of first adhesive portions 38 and the upper film speaker electrode layer 35 is bent at both sides so that one end of the upper film speaker electrode layer 35 is disposed on the pair of second adhesive portions 39 and the other end thereof is connected to the lower film speaker electrode layer 37, such that a vacuum space 36 may also be formed on the film speaker substrate 31.

Likewise, the upper and lower substrates 210 and 230 are rigid substrates and a second pad portion 213 protrudes from the edge of the lower substrate 230 facing substrate 210. In this case, a second FPC unit 295 may be connected to the second pad portion 231 through a pair of third adhesive portions 58 so that driving of the film type microphone 50 may be performed, and the drive IC 250 may be integrated therein.

Similarly, the film type microphone 50 includes a film type microphone substrate 51, a protection cap 53 mounted inside the air hole 206 in order to protect the film microphone substrate 51, an upper film microphone electrode layer 55, and a lower film microphone electrode layer 57.

Further, the pair of third adhesive portions 58 is disposed at a predetermined interval from the lower film microphone electrode layer 57, and the film microphone substrate 51 is installed on the pair of third adhesive portions 58, thereby forming a vibration space 56 below the film microphone substrate 51.

Further, a pair of fourth adhesive portions 59 is disposed on the pair of third adhesive portions 58 and the upper film microphone electrode layer 55 is bent at both sides so that one end of the upper film microphone electrode layer 55 is disposed on the pair of fourth adhesive portions 59 and the other end thereof is connected to the lower film microphone electrode layer 57, such that a vacuum space 56 may also be formed on the film microphone substrate 51.

The upper and lower substrates 210 and 230 or the window layer 201 may be formed of tempered glass or general plate glass or a transparent synthetic resin film. Here, the tempered glass includes glass tempered by heating molded plate glass at 500 to 600° C. which is close to a glass transition temperature (Tg), rapidly cooling the plate glass by compressed cooling air, and subjecting a surface of the glass to compressive deformation, and the inside to tensile deformation. Alternatively, the glass may be chemically tempered by ion substitution. Further, as the transparent synthetic resin film, any synthetic resin film which is transparent and has high strength may be applied, and the transparent synthetic resin film is preferably made of polycarbonate or polymethyl methacrylate (PMMA).

When the display panel 200 is a liquid crystal panel, in a lower substrate 230, a pixel area 231 is formed to perform a display that displays images according to its liquid crystal alignment. As is known, gate lines and data lines may be formed to cross each other on the lower substrate 231 to thereby define the pixel area 231.

Further, a transparent electrode layer 211 constituting a common electrode may be formed on the upper substrate 210.

The transparent electrode layer 211 is formed by depositing a material, which is transparent and has electric conductivity, and etching the material in a predetermined pattern. Layer 211 is preferably made of indium tin oxide (ITO), but in some cases, indium zinc oxide (IZO), indium tin zinc oxide (ITZO), antimony tin oxide (ATO), carbon nanotube (CNT), a conductive polymer, and the like may be applied.

Further, when the transparent electrode layer 211 is made of ITO, the thickness of the transparent electrode layer 211 may range from 0.01 to 0.02 μm. More specifically, when the thickness is smaller than 0.01 μm, in the layer 211 may be of insufficient conductivity and mechanical strength, and when the thickness is larger than 0.02 μm, the layer 211 may be difficult to etch or otherwise pattern.

The first and second pad portions 213 are configured to include any suitable conductive materials, such as transparent electrode links, anisotropic conductive films (ACFs) made of an anisotropic conductive material, and metal electrode layers made of a material having better conductivity than that of the transparent electrode links.

The first and second pad portions 213 are disposed in parallel at both edges of the transparent electrode layer 211, and apply a voltage to generate a potential difference between both ends of the transparent electrode layer 211.

For this purpose, the metal electrode layers are preferably made of silver (Ag) having excellent electric conductivity, but may be made of copper (Cu), aluminum (Al) or an alloy of a metal having excellent electric conductivity. Further, the metal electrode layers may be formed by printing or depositing corresponding metal paste.

In the meantime, the film speaker substrate 31 may be made of a piezoelectric polymer film or glass. Here, when film speaker substrate 31 is made of glass, the thickness may be relatively large compared to the case in which the piezoelectric polymer film is used, but a function of the speaker may be improved.

In this case, the piezoelectric polymer film is a polymer film which is an insulator, and is preferably made of polyvinylidene fluoride (PVDF). However, in some cases, other fluorine resins such as polytetrafluoroethylene (PTEE) and fluorinated ethylene propylene (FEP) may be used.

In this case, the upper and lower film speaker electrode layers 35 and 37 may be formed of a metal, which is an opaque conductive material having relatively excellent electric conductivity, different from that of the transparent electrode layer 211 formed below the upper substrate 210 of the display panel 200, thereby improving a function of the film type speaker.

In the first modified exemplary embodiment, the lower film speaker electrode layer 37 may be made of the same material as the metal electrode layers.

The air holes 206 and 208 may improve the transmission of sound waves by directly exposing the film type speaker 30 or microphone 50 to the environment, and positioning air layers on and below the exposed film type speaker 30 or microphone 50.

Meanwhile, shapes or sizes of cross sections of the air holes 206 and 208 may vary depending on a kind or design of display device to which the display panel 200 is applied.

According to the first modified exemplary embodiment, the lower film electrode layer 37 or 57 of the film type speaker 30 or film type microphone 50 is connected to first pad portion 213 of the upper substrate 210 or the second pad portion 213 of the lower substrate 230. This connection is accomplished by an offset between the upper substrate 210 and the lower substrate 230, and first and second FPC units 295, such that an additional process for forming a separate pad portion for connection to the driver IC 250 is not required.

Figure 4:
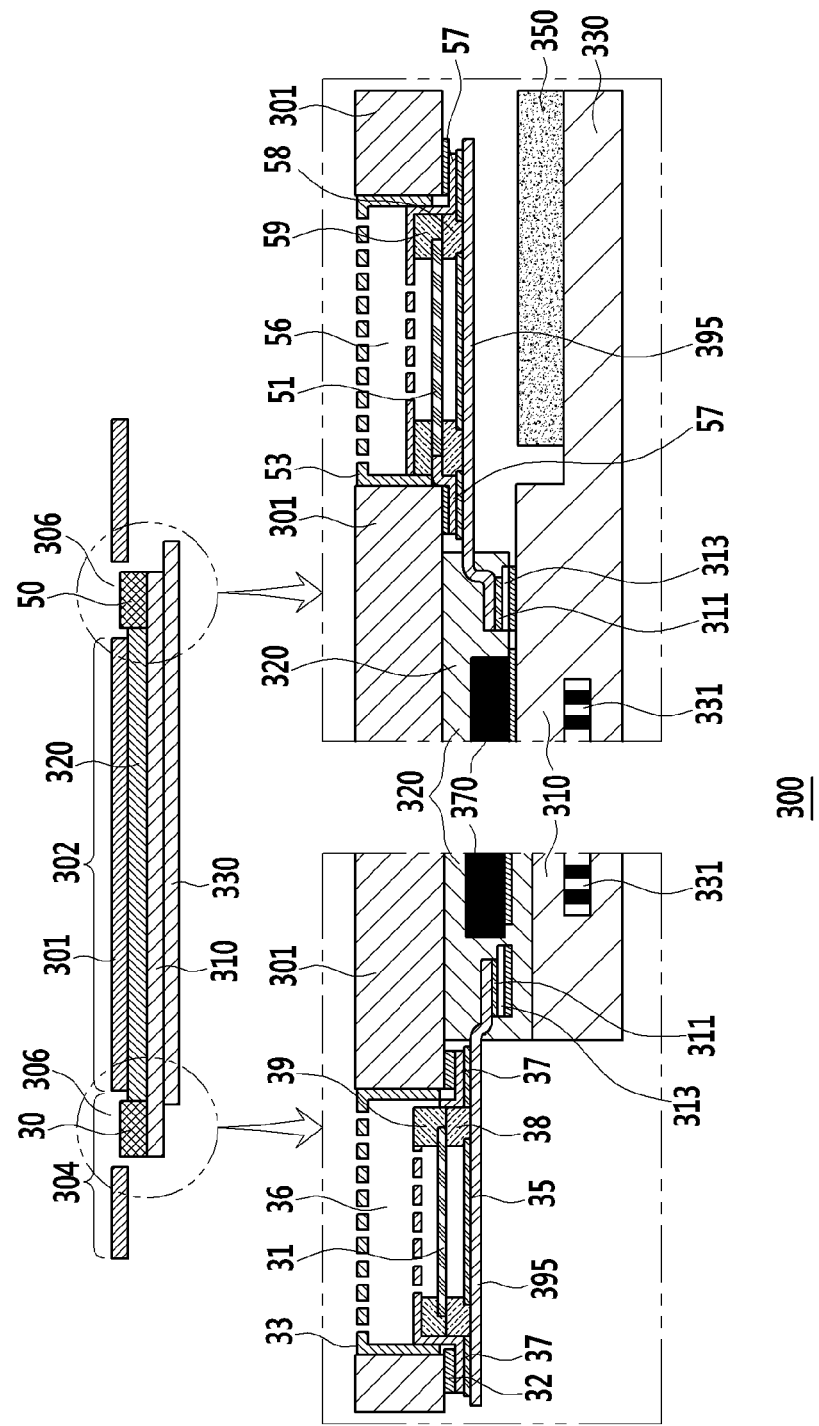
FIG. 4 is a partially enlarged cross-sectional view illustrating a connection relationship of a film type speaker and a display panel according to a second modified exemplary embodiment.

As illustrated in FIG. 4, a plane structure of a second display panel 300 is divided into a display area 302 and a non-display area 304, which are substantially the same as the respective areas of the first display panel 200 of FIG. 3.

Characteristics of the respective layers constituting the second display panel 300 are the same as those of the first display panel 200, and thus for detailed descriptions thereof, those of the respective layers of the first display panel 200 are referred to.

However, the second display panel 300 is different from the first display panel 200 in that in the non-display area 304, at a lower part of the speaker air hole 306, the upper and lower substrates 310 and 330 both have rigidity and have the same length, i.e. there is no offset between the left sides of substrates 310 and 330, near the air hole 306. Also, at a lower part of the microphone air hole 308, the lower substrate 330 extends to be longer than the upper substrate 310, such that a driver IC 350 is installed and integrated in the lower substrate 330. That is, an offset does exist between the right sides of substrates 310 and 330, near the air hole 308.

In addition, the second display panel 300 further includes a polarization layer 370 for performing a polarization function between the upper substrate 310 and the window layer 301, and in order to support and protect the polarization layer 370, the polarization layer 370 is installed to be embedded in a synthetic resin passivation layer 320.

Further, a transparent electrode layer 311 may be additionally provided below the polarization layer 370 so that the polarization layer 370 is less influenced by static electricity or the like.

In the second display panel 300 according to the second modified exemplary embodiment, in order to drive-connect the display panel 300 and the film type speaker 30 or film type microphone 50, a common contact pad portion 313 connected to the transparent electrode layer 311 may be separately formed in the synthetic resin layer 320.

The common contact pad portion 313 has a transparent electrode layer 311, and an adhesive layer made of an anisotropic conductive material and a metal electrode layer, which are formed on the transparent electrode layer 311, and may be formed by a separate process from that of the transparent electrode layer 311.

As described above, the common contact pad portion 313 is formed within the synthetic resin passivation layer 320 on the upper substrate 310 to be formed at almost the same height as the lower film electrode layer 37 or 57 of the film type speaker 30 or film type microphone 50. In this manner, the portions of first and second FPC units 395 are nearly planar, with portions that differ only slightly in elevation. This facilitates easier wiring work, reducing the length of the first and second FPC units 395 used, and more easily assembling the display.

Figure 5:
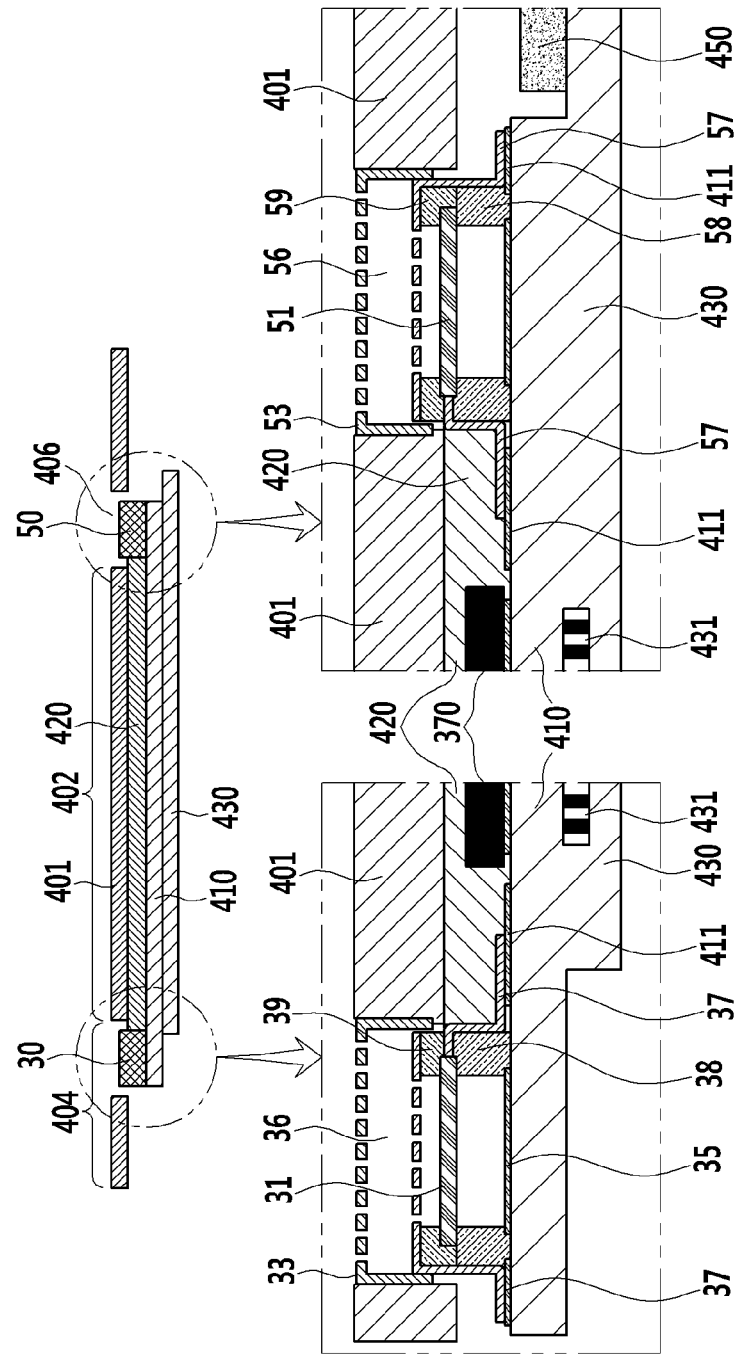
FIG. 5 is a partially enlarged cross-sectional view illustrating a connection relationship of a film type speaker and a display panel according to a third modified exemplary embodiment

As illustrated in FIG. 5, a third display panel 400 according to a third modified exemplary embodiment is divided into a display area 402 and a non-display area 404, as in the first display panel 200 of FIG. 3.

Characteristics of the respective layers constituting the third display panel 400 are the same as those of the first display panel 200, and thus for detailed descriptions thereof, those of the respective layers of the first display panel 200 are referred to.

However, the third display panel 400 is different from the first display panel 200 in that in the non-display area 404, an upper substrate 410 extends to overlap a lower part of a speaker air hole 406, and similarly, the upper substrate 410 extends to overlap a lower part of a microphone air hole 408. Also, a lower substrate 430 is offset from the upper substrate 410 to extend beyond the upper substrate 410 at the microphone air hole 408 side, thereby providing a space where a driver IC 450 is installed and integrated.

Further, in the third display panel 400 according to the third modified exemplary embodiment, a lower film electrode layer 37 or 57 of the film type speaker 30 or the film type microphone 50 is configured to be electrically connected directly to a transparent electrode layer 411 formed on the upper substrate 410 so as to be drive-connected to the display panel 400.

In this embodiment, the lower film electrode layers 37 and 57 may be formed on the transparent electrode layer 411. Also, the transparent electrode layer 411 is sandwiched between the upper substrate 410 and a polarization layer 470 installed on the upper substrate 410 to perform a polarization function, and the polarization layer 470 and the transparent electrode layer 411 may be supported and protected while being embedded in or covered by a synthetic resin passivation layer 420.

The synthetic resin passivation layer 420 extends up to the vicinity of the film type speaker 30 or film type microphone 50, to be coupled to side surfaces of the pair of first and second adhesive portions 38 and 39 of the film type speaker 30 or film type microphone 50. The upper film adhesive layers 37 and 57 may be bent and connected along the coupled side surfaces.

As described above, the third display panel 400 is configured such that the upper substrate 410 extends to overlap the lower part of the film type speaker 30 or film type microphone 50, to thereby directly connect a transparent electrode layer 411 disposed on the upper substrate 410 to the lower film electrode layer 37 or 57 of the film type speaker 30 or film type microphone 50, so that no FPC unit is needed.

Accordingly, the drive-connection of the film type speaker 30 or film type microphone 50 to the display panel 400 is protected and supported by the synthetic resin passivation layer 420 on the upper substrate 410, thereby reducing concerns about failure due to durability and detachment and increasing reliability by omitting the FPC.

Figure 6:
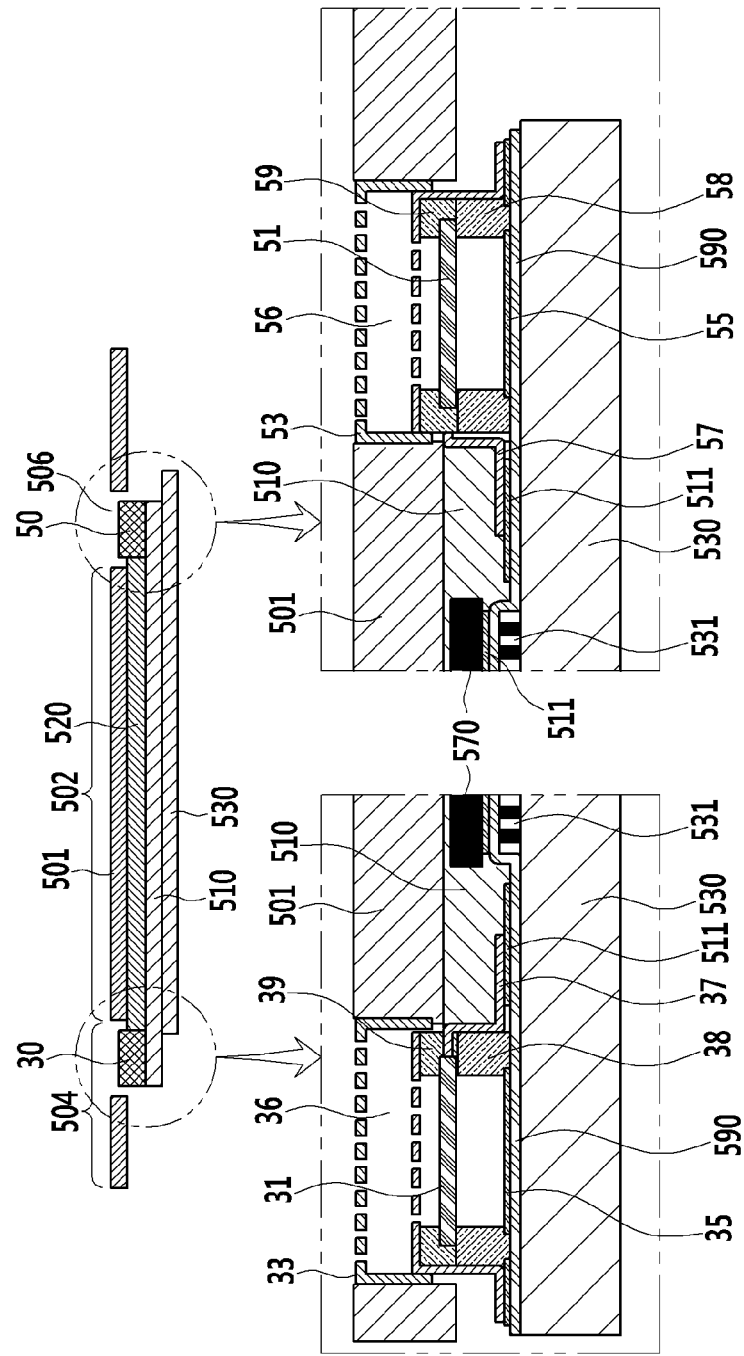
FIG. 6 is a partially enlarged cross-sectional view illustrating a connection relationship of a film type speaker and a display panel according to a fourth modified exemplary embodiment.

As illustrated in FIG. 6, a fourth display panel 500 according to a fourth modified exemplary embodiment is divided into a display area 502 and a non-display area 504, like the first display panel 200 of FIG. 3

Characteristics of the respective layers constituting the fourth display panel 500 according to the fourth modified exemplary embodiment are almost the same as those of the first display panel 200, but the fourth display panel 500 is different from the first display panel 200 in that a thin film encapsulation (TFE) layer 510 is used instead of a rigid upper substrate, and a pixel area 531 is formed inside the TFE layer 510.

As an example, the TFE layer 510 may include an organic encapsulation layer, which may encapsulate an organic light emitting element and the like.

Meanwhile, when the fourth display panel 500 according to the fourth modified exemplary embodiment is an organic light emitting panel, unlike with a liquid crystal panel, it is not necessary to install a backlight unit. Thus, the lower substrate 530 need not support a backlight unit, and may therefore be thinner and more flexible. As it can be flexible, the lower substrate 530 can be made of, for example, PMMA, acryl, polyester and the like.

Further, the fourth display panel 500 according to the fourth modified exemplary embodiment is configured such that the lower film electrode layer 37 or 57 is electrically connected directly to a transparent electrode layer 511 formed on the TFE layer 510 so as to be drive-connected to the display panel 500.

In this embodiment, the lower film electrode layers 37 and 57 are formed on the transparent electrode layer 511. Also, the TFE layer 510 and the lower substrate 530 extend to overlap a lower part of the film type speaker 30 or film type microphone 50, the transparent electrode layer 511 is sandwiched between the TFE layer 510 and a polarization layer 570 installed on the TFE layer 510 to perform a polarization function, and the polarization layer 570 and the transparent electrode layer 511 may be supported and protected while being embedded in or covered by a synthetic resin passivation layer 510.

Similarly, the synthetic resin passivation layer 510 extends up to the vicinity of the film type speaker 30 or film type microphone 50 to be coupled to side surfaces of a pair of first and second adhesive portions 38 and 39 or 58 and 59 of the film type speaker 30 or film type microphone 50. Also, the upper film adhesive layers 37 and 57 may be bent and connected along the coupled side surface.

As described above, the fourth display panel 500 is configured such that the TFE layer 510 and the lower substrate 530 extend up to overlap the lower parts of the film type speaker 30 and film type microphone 50 to thereby directly connect the transparent electrode layer 511 disposed on the TFE layer 510 to the lower film electrode layer 37 or 57 of the film type speaker 30 or film type microphone 50 with no FPC unit.

Accordingly, the drive-connection of the film type speaker 30 or film type microphone 50 and the display panel 500 is protected and supported by the synthetic resin passivation layer 510 on the lower substrate 530 supporting the TFE layer 510, thereby reducing concerns about failure due to durability and detachment and eliminating the need for an FPC.

Figure 7:
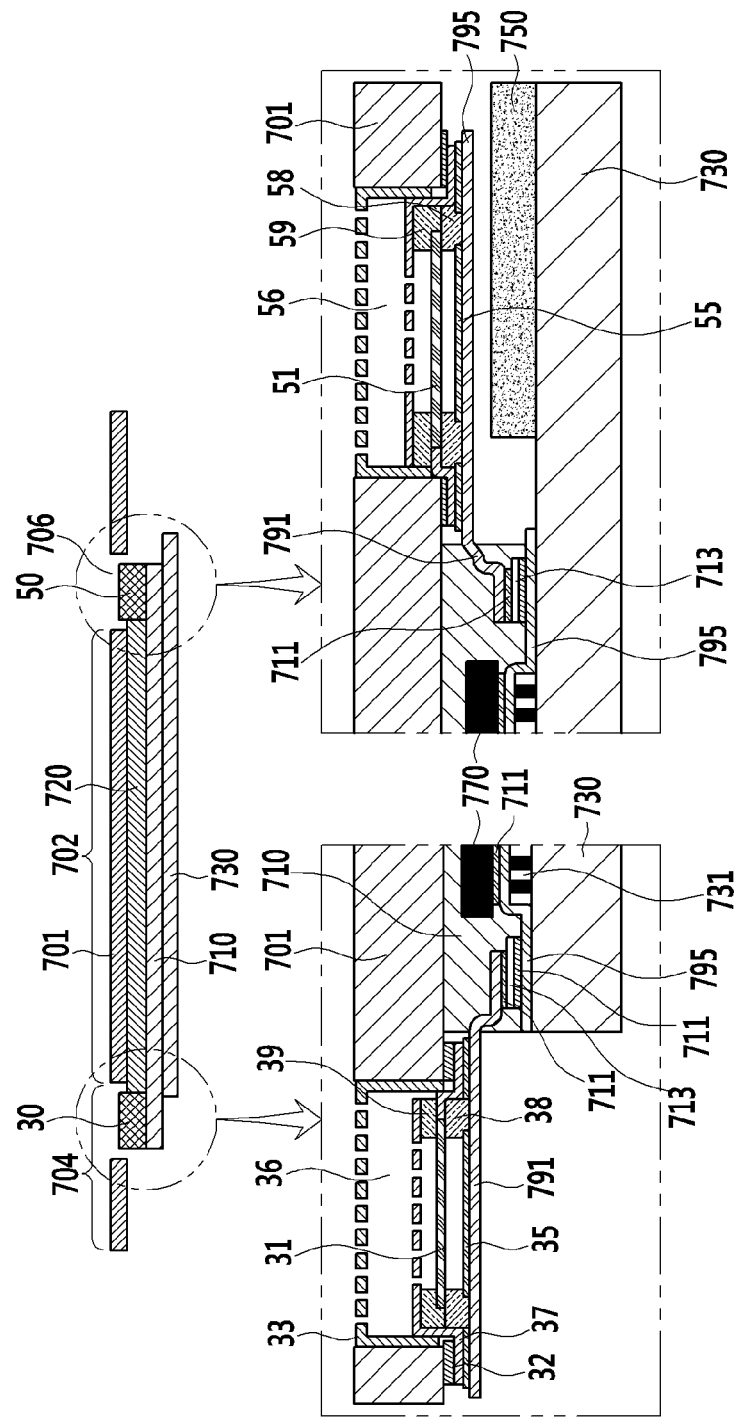
FIG. 7 is a partially enlarged cross-sectional view illustrating a connection relationship of a film type speaker and a display panel according to a fifth modified exemplary embodiment.

As illustrated in FIG. 7, a fifth display panel 700 is divided into a display area 702 and a non-display area 704, as with the first display panel 200 of FIG. 3.

Characteristics of the respective layers constituting the fifth display panel 700 are the same as those of the first display panel 200 or the fourth display panel 500, and thus for detailed descriptions, those of the respective layers of the first display panel 200 or the fourth display panel 500 are referred to.

However, the fifth display panel 700 is different from the fourth display panel 500 in that the film type speaker 30 or the film type microphone 50 integrated with a window layer 701 is drive-connected to a driver IC 750 by using an FPC unit 791 connected to a common contact pad portion 713 of the fifth display panel 700.

In this case, at a lower part of a speaker air hole 706 of the display area 702, a TFE layer 710 and a lower substrate 730 have the same length, and are spaced apart from the speaker 30, and at a lower part of a microphone air hole 708, only the lower substrate 730 extends to be longer than the TFE layer 710, thereby providing a space where the driver IC 750 is installed and integrated.

The fifth display panel 700 further includes a polarization layer 770 for performing a polarization function between the TFE layer 710 and the window layer 701, but is similar to the fourth display panel 500 in that in order to support and protect the polarization layer 770, the polarization layer 770 is embedded in TFT layer 710, which is a synthetic resin passivation layer. A transparent electrode layer 711 is additionally installed below the polarization layer 770 so that the polarization layer 770 is less influenced by static electricity or the like in relation to the TFE layer 710 made of glass or a synthetic resin.

In the fifth display panel 700 according to the fifth modified exemplary embodiment, in order to drive-connect the fifth display panel 700 and the lower film electrode layer 37 or 57 by using first and second FPC units 791 and 795, a common contact pad portion 713 connected to the transparent electrode layer 711 may be separately formed on the TFE layer 710.

The common contact pad portion 713 has a transparent electrode layer 711, and an adhesive layer made of an anisotropic conductive material and a metal electrode layer, which are formed on the transparent electrode layer 711, and may be formed by a separate process from that of the transparent electrode layer 711.

As described above, the common contact pad portion 713 is formed in the synthetic resin TFE layer 710 to be formed at almost the same height as the lower film electrode layer 37 or 57 of the film type speaker 30 or film type microphone 50, such that the first and second FPC units 791 and 795 may be formed almost planar, thereby facilitating wiring work, reducing the length of the first and second FPC units 791 and 795 used, and reducing concerns about failure due to wire detachment of the first and second FPC units 791 and 795.

Figure 8:
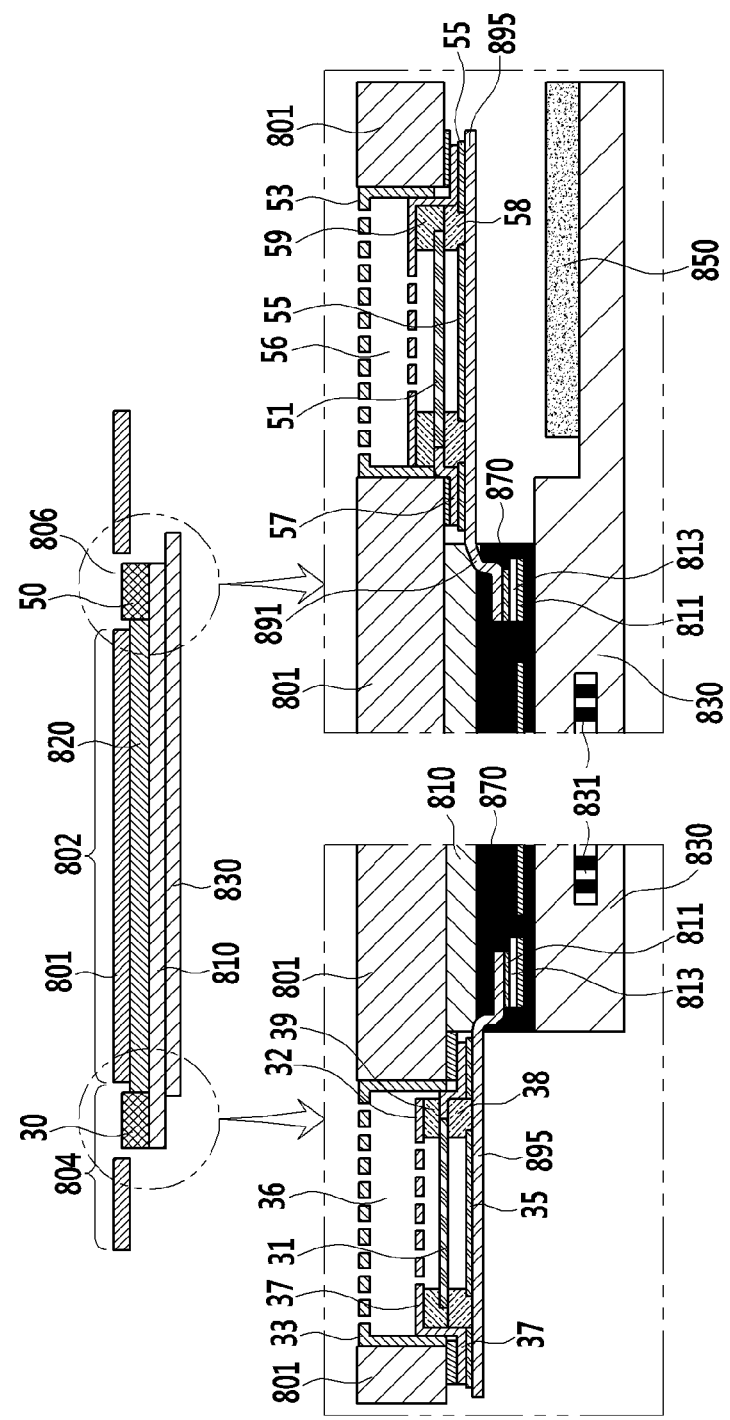
FIG. 8 is a partially enlarged cross-sectional view illustrating a connection relationship of a film type speaker and a display panel according to a sixth modified exemplary embodiment.

As illustrated in FIG. 8, a sixth display panel 800 is divided into a display area 802 and a non-display area 804, as in the first display panel 200 of FIG. 3.

Characteristics of the respective layers constituting the sixth display panel 800 are the same as those of the first display panel 200 or the fourth display panel 500, and thus for detailed descriptions thereof, those of the respective layers of the first display panel 200 or the fourth display panel 500 are referred to.

However, like the fifth display panel 700, the sixth display panel 800 is different from the fourth display panel 500 in that the film type speaker 30 or the film type microphone 50 integrated with a window layer 801 is drive-connected to a driver IC 850 by using an FPC unit 895 connected to a common contact pad portion 813 of the sixth display panel 800.

In this case, at a lower part of a speaker air hole 806 of the display area 802, a TFE layer 810 and a lower substrate 830 have the same length, and are spaced apart from the speaker 30, and at a lower part of a microphone air hole 808, only the lower substrate 830 extends to be longer than the TFE layer 810, thereby providing a space where the driver IC 850 is installed and integrated.

The sixth display panel 800 further includes a polarization layer 870 for performing a polarization function between the TFE layer 810 and the window layer 801, and in the sixth display panel 800, the polarization layer 870 may be configured to have a flexibility like the TFE layer 810 and the lower substrate 830.

The polarizer in the related art is generally implemented to have a structure in which a polarizer is interposed between upper and lower support layers, but the polarizer serves to control the quantity of transmitted light depending on a polarization degree of incident light, and may be implemented by a film made of polyvinyl alcohol (PVA). For example, the polarizer implements polarization by stretching a PVA film having iodine absorbed therein by strong tension.

Further, the support layers provided on upper and lower parts of the polarizer may be implemented by a film made of triacetyl cellulose (TAC) for protecting and supporting the PVA film.

In addition, at least one support layer provided in the polarizer of the related art may be removed in the disclosed embodiments. Support may instead be implemented by a material having a flexible characteristic, or the polarizer may be implemented by forming a coating polarization layer on the flexible support.

In order to support and protect the polarization layer, a synthetic resin passivation layer 810 may be additionally formed on the polarization layer 870.

Further, in the sixth display panel 800, the polarization layer 870 includes a transparent electrode layer 811 therein, and in order to drive-connect the sixth display panel 800 and the lower film electrode layer 37 or 57 of the film type speaker 30 or the film type microphone 50 integrated with a window layer 801 by using first and second FPC units 891 and 895, a common contact pad portion 813 connected to the transparent electrode layer 811 may be separately formed in the polarization layer 870.

The common contact pad portion 813 has a transparent electrode layer 811, and an adhesive layer made of an anisotropic conductive material and a metal electrode layer, which are formed on the transparent electrode layer 811, and may be formed by a separate process from that of the transparent electrode layer 811.

As described above, the common contact pad portion 813 is formed in the polarization layer 870 to be formed at almost the same height as the lower film electrode layer 37 or 57 of the film type speaker 30 or the film type microphone 50, such that the first and second FPC units 891 and 895 are nearly planar, thereby facilitating wiring work, reducing the length of the first and second FPC units 891 and 895 used, and reducing concerns about failure due to wire detachment of the first and second FPC units 891 and 895.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can be mixed and matched in any manner, to produce further embodiments consistent with the invention.

What is claimed is:

1. A speaker and microphone integrated display panel, comprising:
    a display panel having a display area and a non-display area surrounding the display area; and
    a simultaneously convertible film type speaker or film type microphone which is mounted to correspond to an air hole in the non-display area,
    wherein the display panel and the film type speaker or the film type microphone at are at least partially integrated so as to be drive-connected, and
    wherein the display panel includes:
        upper and lower substrates arranged opposite to each other,
        a window layer positioned so as to protect the upper and lower substrates and having the air hole formed therein,
        a polarization layer positioned between the upper substrate and the window layer to polarize light emitted from the upper substrate, and
        a synthetic resin passivation layer covering the polarization layer.

2. The speaker and microphone integrated display panel of claim 1, wherein the film type speaker or film type microphone includes:
    a film type speaker or microphone substrate,
    a protection cap mounted in the air hole to protect the film type speaker or microphone substrate, and
    an upper film speaker electrode layer or upper film microphone electrode layer which is an upper electrode layer, and a lower film speaker electrode layer or a lower film microphone electrode layer which is a lower electrode layer, the upper and lower electrode layers being connected to at least one adhesive portion made of an anisotropic conductive material.

3. The speaker and microphone integrated display panel of claim 2, wherein:
    the upper substrate and the lower substrate are offset from each other, so as to expose first and second pad portions to which a signal line of the display panel is connected, and
    the exposed first and second pad portions are connected to first and second flexible printed circuit (FPC) units, the first and second FPC units also being connected to the lower film speaker electrode layer and the lower film microphone electrode layer.

4. The speaker and microphone integrated display panel of claim 2, wherein:
    the upper substrate and the lower substrate are disposed so that at least one edge of the upper substrate is substantially coplanar with at least one edge of the lower substrate,
    a common contact pad portion is formed within the synthetic resin passivation layer to be connected to a transparent electrode layer that is both disposed below the polarization layer and connected to first and second flexible printed circuit (FPC) units, and the first and second FPC units are connected to the lower film speaker electrode layer and the lower film microphone electrode layer.

5. The speaker and microphone integrated display panel of claim 4, wherein:

the lower film speaker electrode layer or the lower film microphone electrode layer comprises a metal electrode layer having greater conductivity than that of the transparent electrode layer.

6. The speaker and microphone integrated display panel of claim 4, wherein:

the upper substrate is a thin film encapsulation (TFE) layer having a plurality of layers that include at least one organic encapsulation layer or inorganic encapsulation layer.

7. The speaker and microphone integrated display panel of claim 6, wherein:

the lower substrate is a flexible substrate comprising at least one of polymethyl methacrylate (PMMA), acryl, and polyester.

8. The speaker and microphone integrated display panel of claim 2, wherein:

the upper substrate and the lower substrate are disposed so that at least one edge of the upper substrate is substantially coplanar with at least one edge of the lower substrate, and the lower film speaker electrode layer or the lower film microphone electrode layer extends to be connected to a transparent electrode layer disposed below the polarization layer, to thereby be drive-connected.

9. The speaker and microphone integrated display panel of claim 8, wherein:

the lower film speaker electrode layer or the lower film microphone electrode layer comprises a same material as that of the transparent electrode layer.

10. The speaker and microphone integrated display panel of claim 8, wherein:

the upper substrate is a thin film encapsulation (TFE) layer having a plurality of layers that include at least one organic encapsulation layer or inorganic encapsulation layer.

11. The speaker and microphone integrated display panel of claim 2, wherein:

the upper substrate and the lower substrate are disposed so that at least one edge of the upper substrate is substantially coplanar with at least one edge of the lower substrate, a common contact pad portion is formed within the polarization layer to be connected to a transparent electrode layer that is both disposed within the polarization layer and connected to first and second flexible printed circuit (FPC) units, and the first and second FPC units are connected to the lower film speaker electrode layer and the lower film microphone electrode layer.

12. The speaker and microphone integrated display panel of claim 11, wherein:

the polarization layer is a rigid polarizer.

13. The speaker and microphone integrated display panel of claim 11, wherein:

the upper substrate is a thin film encapsulation (TFE) layer having a plurality of layers that include at least one organic encapsulation layer or inorganic encapsulation layer, and the polarization layer comprises a flexible substrate.

* * * * *